United States Patent [19]

Ecklund

[11] Patent Number: 4,618,981

[45] Date of Patent: Oct. 21, 1986

[54] TONE DETECTOR WITH PSEUDO PHASE LOCKED LOOP

[75] Inventor: Lawrence M. Ecklund, Wheaton, Ill.

[73] Assignee: Motorola, Inc., Schaumburg, Ill.

[21] Appl. No.: 706,583

[22] Filed: Feb. 28, 1985

[51] Int. Cl.[4] ............................................. H04H 5/00
[52] U.S. Cl. ........................................ 381/15; 381/58;
179/84 VF; 324/79 D; 328/139
[58] Field of Search .................... 381/56, 58, 15, 16;
324/79 R, 79 D; 328/134, 138, 139; 179/84 VF

[56] References Cited

U.S. PATENT DOCUMENTS

| | | | |
|---|---|---|---|
| 4,021,653 | 5/1977 | Sharp et al. | 324/79 D |
| 4,344,038 | 8/1982 | Streeter | 381/15 |
| 4,367,444 | 1/1983 | Gardner et al. | 328/134 |
| 4,368,356 | 1/1983 | Ecklund et al. | 381/15 |
| 4,377,728 | 3/1983 | Hilbert | 38/15 |
| 4,405,897 | 9/1983 | Taylor et al. | 324/79 D |
| 4,520,503 | 5/1985 | Kirst et al. | 381/56 |

Primary Examiner—Forester W. Isen
Attorney, Agent, or Firm—Margaret Marsh Parker; James W. Gillman

[57] ABSTRACT

The tone detector provides accurate detection of a single predetermined tone frequency within a mixture of frequencies, utilizing a carrier signal source at a relatively high frequency. The high frequency signal is divided down to two frequencies, one just above and one just below the tone. The divider output is then maintained at the frequency of the tone by continuously adjusting the divisor number between the two divisor values. Multiplying the received signal or a portion thereof by the divider output provides a detect signal when the tone is present in the received signal with sufficient amplitude.

1 Claim, 3 Drawing Figures

TONE DETECTOR WITH PSEUDO PHASE LOCKED LOOP

This invention relates to the field of tone detectors and, more particularly, to detectors for use in AM stereo broadcast reception.

In many fields such as that of AM stereo, a single tone must be detected reliably and with accuracy. In the prior art, many systems have been devised for detecting a single frequency within a multi-frequency signal. Some of these have used a band-pass filter or a phase locked loop. In order to have accurate detection, the components of the filter must be very accurate, typically requiring ±1% tolerances. Such components are naturally relatively expensive. When the cost of the adjustable elements of a PLL is included, the total may be out of the question except in top of the line devices. What is most desirable is a low cost detector having greater accuracy than the prior art and requiring no adjustable elements.

SUMMARY

An object of the present invention is to provide a tone detector which is highly accurate and very reliable.

A more particular object is to provide such a detector without requiring any high precision, high cost, or adjustable components.

Still another object is that the detector not require large areas on an IC.

These and other objects which will become apparent are obtained in a detector according to the present invention wherein a pseudo phase locked loop is achieved by using a fixed oscillator frequency such as the IF frequency with a programmable divider to create two frequencies, slightly above and below the desired frequency, respectively. The divider output is multiplied by the signal containing the received tone and, after filtering, a DC signal is produced which indicates the direction of the error in the derived frequency. The error signal controls the choice of divisor numbers so that the average output of the divider is maintained at the desired frequency. A second divider output is phase shifted to be in quadrature with the first output and, when this signal is multiplied by the signal containing the desired tone and then integrated, the resultant signal indicates the absence or presence of the tone. If the integrated signal is at an appropriate level, it can be used to control any circuit which is dependent on the presence of the tone, such as the stereo presence indicator lamp of a AM stereo receiver.

DETAILED DESCRIPTION OF A PREFERRED EMBODIMENT

Figure 1:
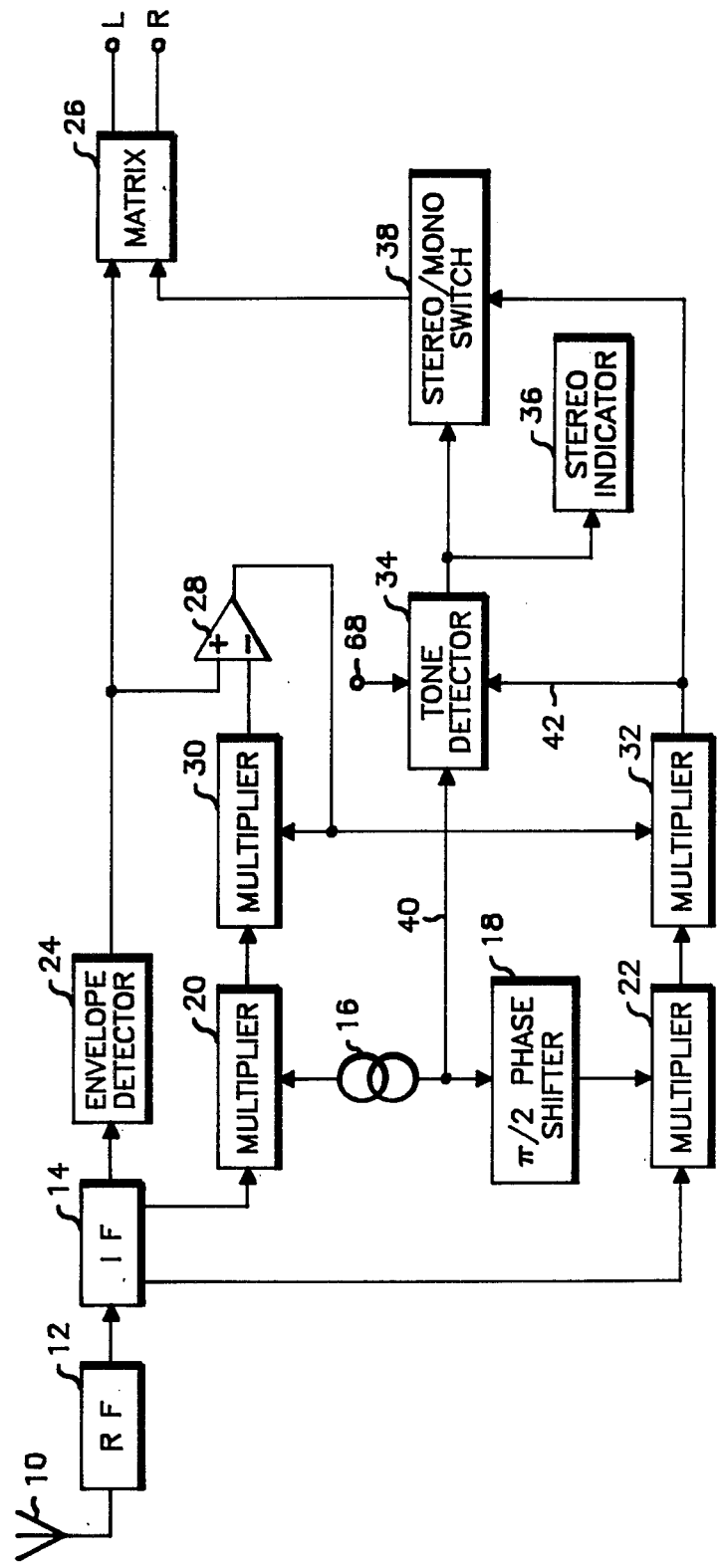
FIG. 1 is a block diagram of an AM stereo receiver including the present invention.

FIG. 1 is a block diagram of an AM stereophonic broadcast receiver which utilizes the present invention. The basic receiver is the subject of a U.S. Pat. No. 4,371,747, assigned to the assignee of the present invention. Its use here is exemplary only and no limitation on the invention should be inferred therefrom.

In this particular receiver, an antenna 10 will receive a signal of the form $(1+L+R)\cos(w_c t+\phi)$, where $\phi = \tan^{-1}[(L-R+A)/(1+L+R)]$. This is a compatible amplitude modulated stereo signal in which L and R stand for the left and right stereophonic signals and A is the pilot tone or "stereo presence" signal. The received signal will be processed in an RF stage 12 and IF stage 14 as is known. A carrier source 16, together with a 90° phase shift network 18, provides two carrier signals in quadrature. The quadrature carriers are at 450 KHz, the IF frequency. In order to detect the stereo sum and difference signals, (L+R) and (L−R), the output of the IF stage 14 is coupled to two multiplier stages 20,22 where it is multiplied by the two quadrature carriers, providing outputs of $(1+L+R)\cos\phi$ and $(L-R+A)\cos\phi$, respectively. The IF output is also coupled to an envelope detector 24 which has as its output the envelope modulation, $(1+L+R)$. This sum signal is coupled to a matrix 26 and also to a comparator 28. In the comparator 28, the sum signal is compared with the output of a multiplier 30. The multiplier 30 has one input of $(1+L+R)\cos\phi$ and a second input from the comparator 28 output. Thus, by means of the comparator providing a correction signal of essentially $(1/\cos\phi)$, the output of the multiplier 30 is forced to be $(1+L+R)$. Similarly, the output of the multiplier 22 is coupled to a multiplier 32 which also receives a correction signal from the comparator 28. The output of the multiplier 32 is thus forced to become $(L-R)$. This difference signal is also coupled to the matrix 26.

In keeping with the present invention, an output 40 is taken from the carrier source 16 and coupled to a tone detector circuit 34 which will be described with respect to FIG. 2. Here the outputs of the tone detector are shown coupled to an indicator 36 and a switching circuit 38. Obviously, the tone detector outputs may be used for whatever purposes are appropriate in a given application.

Figure 2:
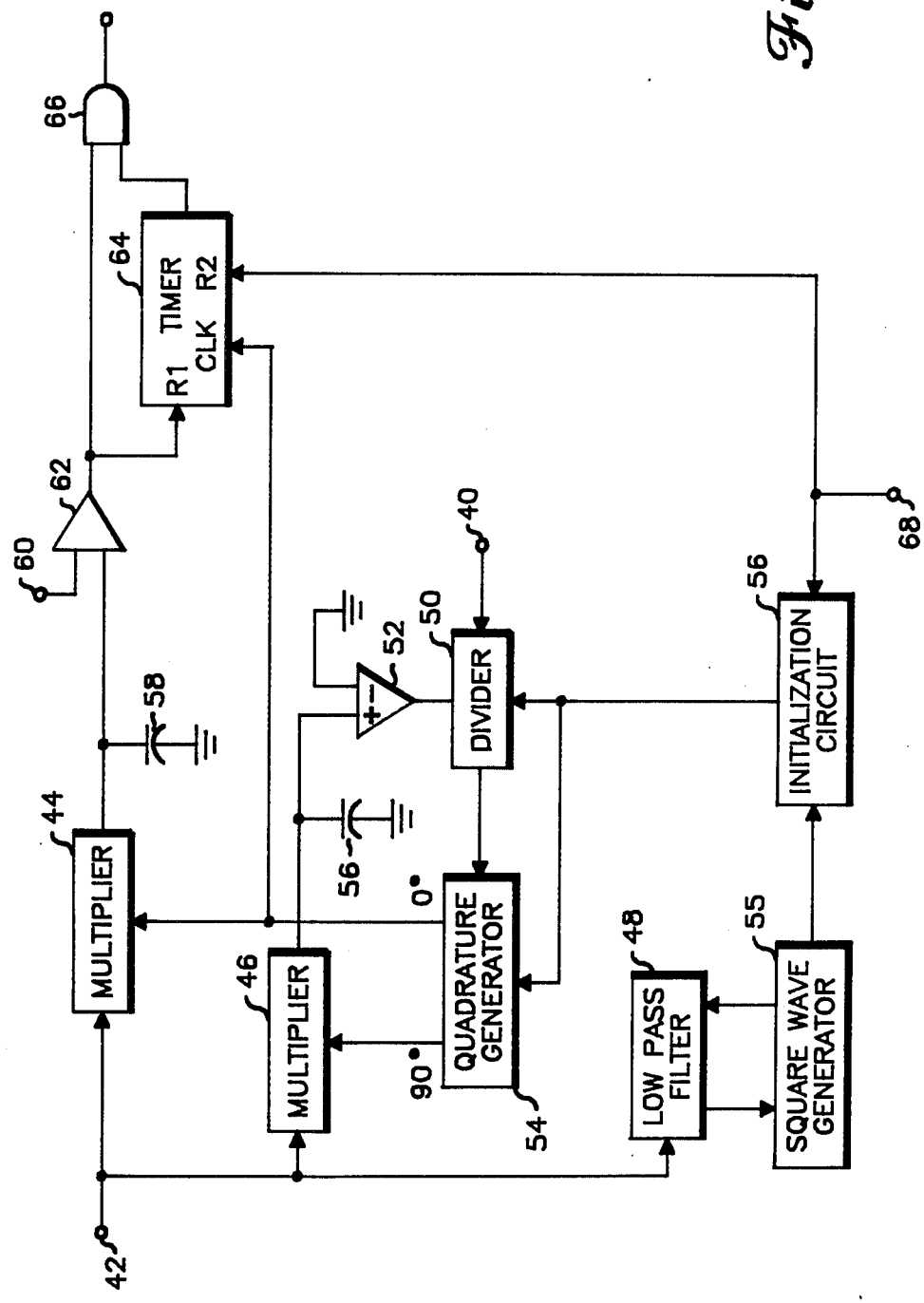
FIG. 2 is a detailed block diagram of the tone detector of FIG. 1.

The block diagram of FIG. 2 shows a preferred embodiment of the tone detector 34 of FIG. 1. The signal input terminal 42 couples the difference signal to two multipliers 44,46, and a low pass filter 48. The difference signal in this embodiment is represented by $(L-R+A)$, where L and R stand for left and right stereophonic signals and A stands for a low frequency tone (25Hz) which is present whenever stereo signals are being broadcast. It is the stereo or pilot tone A which is to be detected in this embodiment. In any application of this invention the signal at terminal 42 would have some range and mixture of frequencies including a single frequency signal which it is necessary to detect reliably.

The terminal 40 brings the 450 KHz signal into the tone detector 34 where it is coupled to a programmable divider circuit 50. The divider circuit has two available divisor numbers and, controlled by a signal from a comparator 52, "toggles" from one number to the other and back, so that the divider output is an average frequency; i.e., the tone frequency (A) to be detected. In the present embodiment, with a source frequency of 450 KHz, the divisors would be 18180 and 17820. As may be seen with respect to FIG. 3, the division process may be accomplished in two steps. Thus the divider output would be either 24.75 or 25.25 Hz, averaging to 25 Hz over a period of time.

The divider output is coupled to a quadrature generator 54 which includes a 90° phase shifting network for providing two output signals in quadrature. The filter 48 output is coupled to a square wave generator 55. After squaring, the signal is coupled to an initializing circuit 56 which ensures that the divider 50 and quad generator 54 are operating in the proper phase relative to the signal A. (See FIG. 3.) The two outputs of the quad generator 54 are coupled to the multipliers 44, 46. Since the 25 Hz input to the multiplier 46 has been phase shifted 90° with respect to the phase of the A signal at terminal 42, the output of the multiplier will be forced to have the same value as the DC reference voltage of the circuit. The basis for this is the trigonometric identity cos A sin A=(sin 2A)/2, with no output at the frequency A. It is assumed that the higher order terms have been filtered out in a filter 57. The multiplier 46 output is coupled to the comparator 52, where it is compared to the ground or the DC reference voltage. If the signal coming into the multiplier 46 from the quad generator 54 is slightly higher than 25 Hz, there will be a DC voltage applied to the input of the comparator 52. This "error" voltage will cause the divider to switch to the larger divisor number, bringing the average frequency toward 25 Hz. When the signal coming into the multiplier 46 is lower than 25 Hz, the comparator output signal will be of the opposite sign, again changing the divisor number in divider 50, this time to the smaller divisor. It can easily be seen that, with a simple R-C network (not shown) coupled to the output of the comparator 52, a DC voltage can be taken off for use in any circuit requiring a signal which is proportional to the distance off frequency.

The "in phase" or 0° output of the quad generator 54 has, of course, also been corrected to an average of 25 Hz. Since it is in phase with the input from terminal 42, the output of the multiplier 44, after filtering in a filter 58, will be proportional to A, based on the identity cos A cos A=(1+cos 2A)/2. It is to be understood that each of the capacitors referenced as 57,58 merely represents a filtering capability. The signal provided at a terminal 60 is a fixed DC reference which, in this embodiment, will be about 20% of the expected maximum level of the signal A. This reference voltage is coupled to a comparator 62 for comparison with the output of the multiplier 44. The output of the comparator 62, then, is a DC signal representative of the presence or absence of the signal A in the broadcast signal received at the antenna 10, and this signal may be coupled to any circuits utilizing the tone detect information.

If an added measure of reliability is required, the additional circuit including a timer 64 and an AND gate 66 may be included. The timer 64 is clocked by the 25 Hz signal from the quad generator 54, but any signal having a suitable frequency would suffice. One reset signal comes from a terminal 68 and is the "mute" or "forced monaural" signal which is present in many stereo radios. In other applications, this signal could be any control signal which would represent a condition where the tone detect is not desired. Alternatively, the signal at terminal 68 could be omitted in some applications. When the is used, and is zero, this input can reset the timer to a short timing period. Another reset signal for the timer comes from the comparator 62, so that when that signal indicates that either no stereo or stereo of insufficient level is present, the timer is reset to a long timing period. Since the output of the timer 64 is coupled to the AND gate 66, along with the pilot detect signal, the pilot detect signal is blocked or "defeated" until the timer runs out and is not reset.

Figure 3:
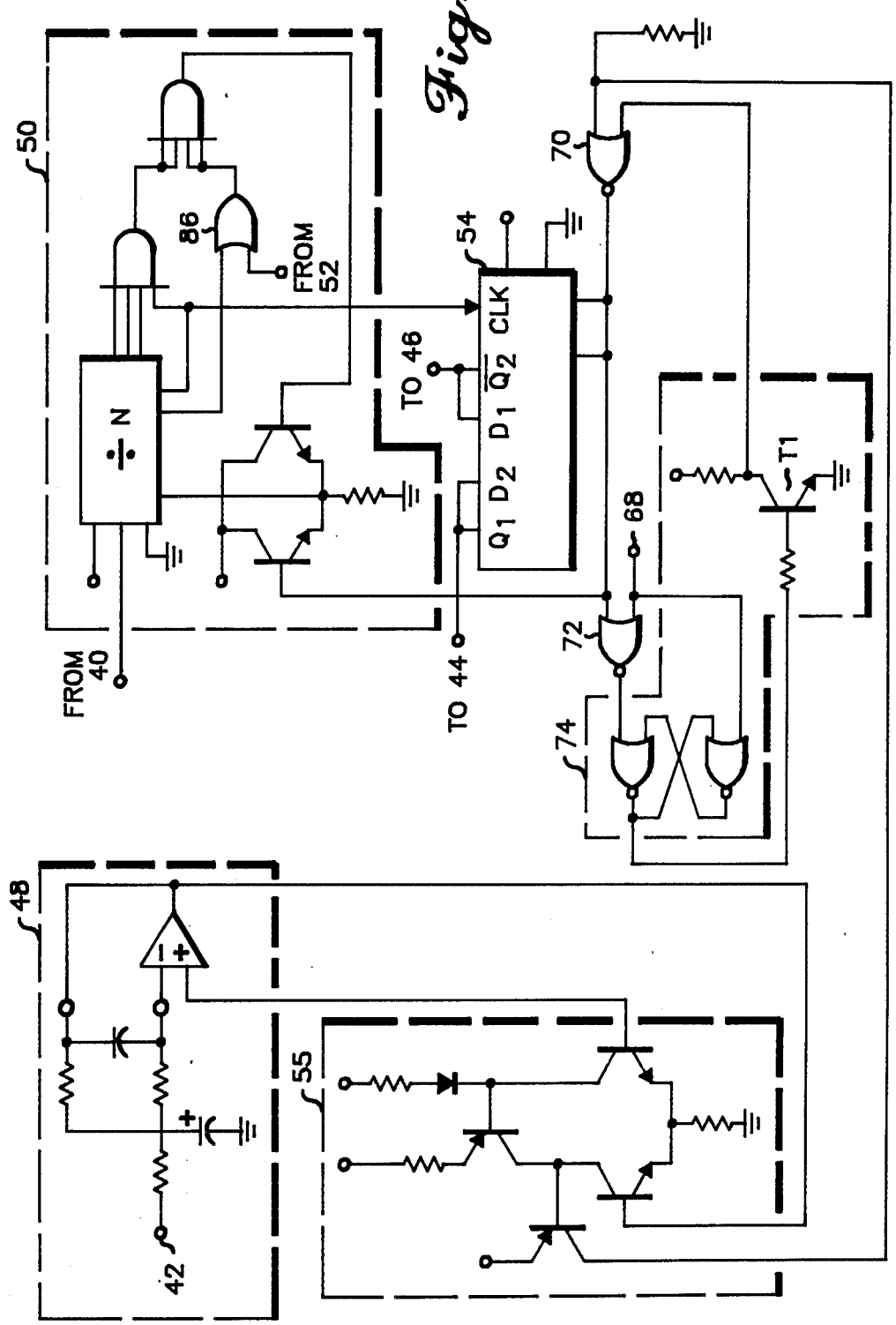
FIG. 3 is a schematic diagram of a portion of the detector of FIG. 2.

FIG. 3 shows exemplary schematic diagrams for some of the elements of the tone detector of FIG. 2. The low pass filter 48 may be omitted in some environments since the signal A may be "clean" enough to use without filtering. Thus either the signal from the terminal 42 or the filter/comparator output will be coupled to the square wave generator 55. The input of the generator 55 is essentially the signal A with some extraneous noise signals. The output of the generator 55, which is essentially a square wave at the frequency A, is coupled to one input of a NOR gate 70, whose output provides the "set" or "initializing" input to the quadrature generator 54. The "mute" input from the terminal 68 is coupled to a NOR gate 72 and to the reset input of a flip-flop 74, both forming parts of the initialization circuit 56. The signal on the terminal 68 must be high for initialization and the output of the flip-flop 74 will also be high. The F/F 74 output is coupled through a transistor T1 to the second input of the NOR gate 70. The output of the NOR 70, which provides the set inputs for the quadrature generator 54 is also coupled to a reset circuit 50 in the divider circuit 50.

The quadrature generator 54 in the present embodiment consists of a dual D-type flip-flop such as the integrated circuit MC14013, manufactured by Motorola, Inc. The clock signal for the quadrature generator 54 has been derived from the divider circuit 50, and is 100 Hz for a 25 Hz signal A. Therefore, in this specific embodiment, the division process is shared by the divider 50 and the quadrature generator 54. The pair of output signals at the output terminals Q1,Q2 of the quadrature generator 54 are in quadrature with each other, with one of them in phase with the signal A at the terminal 42. The divider circuit 50 may be as shown or any appropriate combination of counters, gates, etc., which will provide the frequency divisions required for any particular environment. It will also be apparent that instead of just two divisor numbers, very close to the predetermined number, there could be a series of divisor numbers, progressively closer to the desired number, allowing the detector to more quickly approach the number.

Thus there has been shown and described a tone detector which not only does not require a phase locked loop and adjustable and/or expensive elements, but provides a much higher degree of accuracy and reliability than a PLL would provide. Other variations and modifications are possible, and it is intended to cover all such as fall within the scope of the appended claims.

I claim:

1. A tone detector comprising:
   an input means for providing a received signal which may contain a tone of a predetermined frequency;
   a signal source for providing a signal having a second frequency, the second frequency being much higher than said predetermined frequency;
   divider means coupled to said signal source and having two divisor numbers for providing a first output signal slightly higher than said predetermined frequency and a second output signal slightly lower than said predetermined frequency, only one of said divisor numbers being enabled at a time;
   control means coupled to the input means and to the divider means for determining the frequency difference between any received tone signal and the divider output and adjusting the choice of divisor number to maintain the average of the divider output at the predetermined frequency;
   phase shifting means coupled to the divider means for shifting a divider means output signal by 90°;
   detect means coupled to the input means and to the phase shifting means for detecting the tone frequency in the received frequency, determining the amplitude of the tone frequency and providing an output signal in response to said amplitude.

* * * * *